(12) United States Patent
Sarangi et al.

(10) Patent No.: US 9,262,293 B2
(45) Date of Patent: Feb. 16, 2016

(54) DEBUG APPARATUS AND METHODS FOR DYNAMICALLY SWITCHING POWER DOMAINS

(71) Applicant: Advanced Micro Devices, Inc., Sunnyvale, CA (US)

(72) Inventors: Shantanu K. Sarangi, San Jose, CA (US); Eric Rentschler, Ft. Collins, CO (US); Rahul Dev, Santa Clara, CA (US); Vikram Chopra, Fremont, CA (US); Mihir Doctor, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 133 days.

(21) Appl. No.: 14/027,725

(22) Filed: Sep. 16, 2013

(65) Prior Publication Data

US 2015/0082093 A1      Mar. 19, 2015

(51) Int. Cl.
  *G06F 11/00*   (2006.01)
  *G06F 11/27*   (2006.01)
  *G01R 31/317*  (2006.01)

(52) U.S. Cl.
  CPC .......... *G06F 11/27* (2013.01); *G01R 31/31705* (2013.01); *G01R 31/31721* (2013.01)

(58) Field of Classification Search
  CPC .................................................. G06F 11/3055
  See application file for complete search history.

(56) References Cited

U.S. PATENT DOCUMENTS

| | | | |
|---|---|---|---|
| 6,842,811 B2 | 1/2005 | Barry et al. | |
| 8,024,591 B2* | 9/2011 | Bertelsen et al. | 713/323 |
| 8,402,314 B2* | 3/2013 | Balkan et al. | 714/31 |
| 8,656,220 B2* | 2/2014 | Lee et al. | 714/30 |
| 8,826,079 B2* | 9/2014 | Gilday et al. | 714/30 |
| 8,966,313 B2* | 2/2015 | Truong et al. | 714/30 |
| 2007/0106923 A1* | 5/2007 | Aitken et al. | 714/718 |
| 2012/0151263 A1* | 6/2012 | Rentschler et al. | 714/30 |
| 2012/0151264 A1* | 6/2012 | Balkan et al. | 714/34 |
| 2013/0080850 A1* | 3/2013 | Swoboda | 714/727 |
| 2013/0159775 A1 | 6/2013 | Balkan et al. | |
| 2014/0013421 A1* | 1/2014 | Hopkins et al. | 726/17 |
| 2014/0032801 A1* | 1/2014 | Nixon et al. | 710/107 |

* cited by examiner

*Primary Examiner* — Christopher McCarthy
(74) *Attorney, Agent, or Firm* — Volpe and Koenig, P.C.

(57) ABSTRACT

Methods and apparatus are provided that facilitate debugging operations for components in dynamic power domains. In an embodiment, an integrated circuit includes hardware sectors associated with observability circuits served by a debug data bus of a debug circuit. A controlled sector residing in a dynamically-controlled power domain may be turned off while the power domain of another sector remains on. To continue to have debug observability all the way through and after these power events, a debug data register is configured to provide data, such as configuration and/or programming data, to the observability circuit of the controlled sector via the debug data bus. A shadow register is configured to capture the data provided to the controlled sector's observability circuit. The shadow register data is used upon restoring power to the controlled sector to restore the controlled sector's observability circuit to a state when the controlled sector was previously powered on.

18 Claims, 5 Drawing Sheets

DEBUG APPARATUS AND METHODS FOR DYNAMICALLY SWITCHING POWER DOMAINS

FIELD OF INVENTION

Embodiments of the subject matter described herein relate generally to electronic circuits, and more particularly, relate to electronic circuits and debug operations performed thereon.

BACKGROUND

In development process of an integrated circuit (IC), it is desirable to ensure that the hardware works correctly in the expected operating space before the IC is shipped in volume. Generally, the use of debug circuits and processes are well known in art to assist in the testing of ICs. U.S. Patent Publication No. 2012/0151263 A1 describes various embodiments of debug circuits and processes.

One challenge is to do a thorough job so that ICs are not deployed in the field, and then significant problems are subsequently discovered (e.g., by an original equipment manufacturer (OEM)). However, this is not always possible. One reason is that insufficient time may be available for cycling the hardware through the entire validation space. Another reason is that certain aspects of the hardware and state machine functionality are opaque (i.e., not easily observable).

For power saving and other purposes, some hardware circuits may be designed to be selectively powered down and/or powered off. Such circuits present additional issues in the testing of ICs.

SUMMARY OF EMBODIMENTS

Methods and apparatus are provided that facilitate debugging operations for components that may include different power domains. In an embodiment, an integrated circuit (IC) includes a plurality of hardware sectors, each hardware sector associated with a debug observability circuit that is served by a debug data bus of a debug circuit. The plurality of hardware sectors includes a controlled sector residing in a dynamically-controlled power domain that may be turned off while the power domain of another sector remains on. However, the need is to be able to maintain debug observability all the way through these power events. To address that a debug data register is configured to provide data, such as configuration and/or programming data, to the debug observability circuit of the controlled sector via the debug data bus. A shadow register is configured to receive and store the data provided to the debug observability circuit of the controlled sector. Control circuitry is configured to utilize the data stored in the shadow register upon a restoration of power to the controlled sector to restore the debug observability circuit associated with the controlled sector to a state reflective of its state when the controlled sector was previously powered on.

In another embodiment, a debug method for integrated circuit (IC) is disclosed. In an example method, the method operates with respect to a plurality of hardware sectors. Each hardware sector is associated with a debug observability circuit that is served by a debug data bus of a debug circuit. The plurality of hardware sectors includes a controlled sector residing in a dynamically-controlled power domain that may be turned off while the power domain of another sector remains on. The example method proceeds by providing data, such as configuration and/or programming data, to the debug observability circuit of the controlled sector via the debug data bus. The data provided to the debug observability circuit of the controlled sector is also captured in a shadow register. The data captured in the shadow register is utilized upon a restoration of power to the controlled sector to restore the debug observability circuit associated with the controlled sector to a state reflective of its state when the controlled sector was previously powered on.

In a further embodiment a non-transitory computer-readable storage medium storing a set of instructions for execution by a general purpose computer to facilitate manufacture of an integrated circuit is provided. The instructions facilitate manufacture of an IC that includes a plurality of hardware sectors, each hardware sector associated with a debug observability circuit that is served by a debug data bus of a debug circuit. The plurality of hardware sectors includes a controlled sector residing in a dynamically-controlled power domain that may be turned off while the power domain of another sector remains on. A debug data register is configured to provide data, such as configuration and/or programming data, to the debug observability circuit of the controlled sector via the debug data bus. A shadow register is configured to receive and store the data provided to the debug observability circuit of the controlled sector. Control circuitry is configured to utilize the data stored in the shadow register upon a restoration of power to the controlled sector to restore the debug observability circuit associated with the controlled sector to a state reflective of its state when the controlled sector was previously powered on.

The non-transitory computer-readable storage medium may include instructions that are hardware description language (HDL) instructions used for the manufacture of a device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
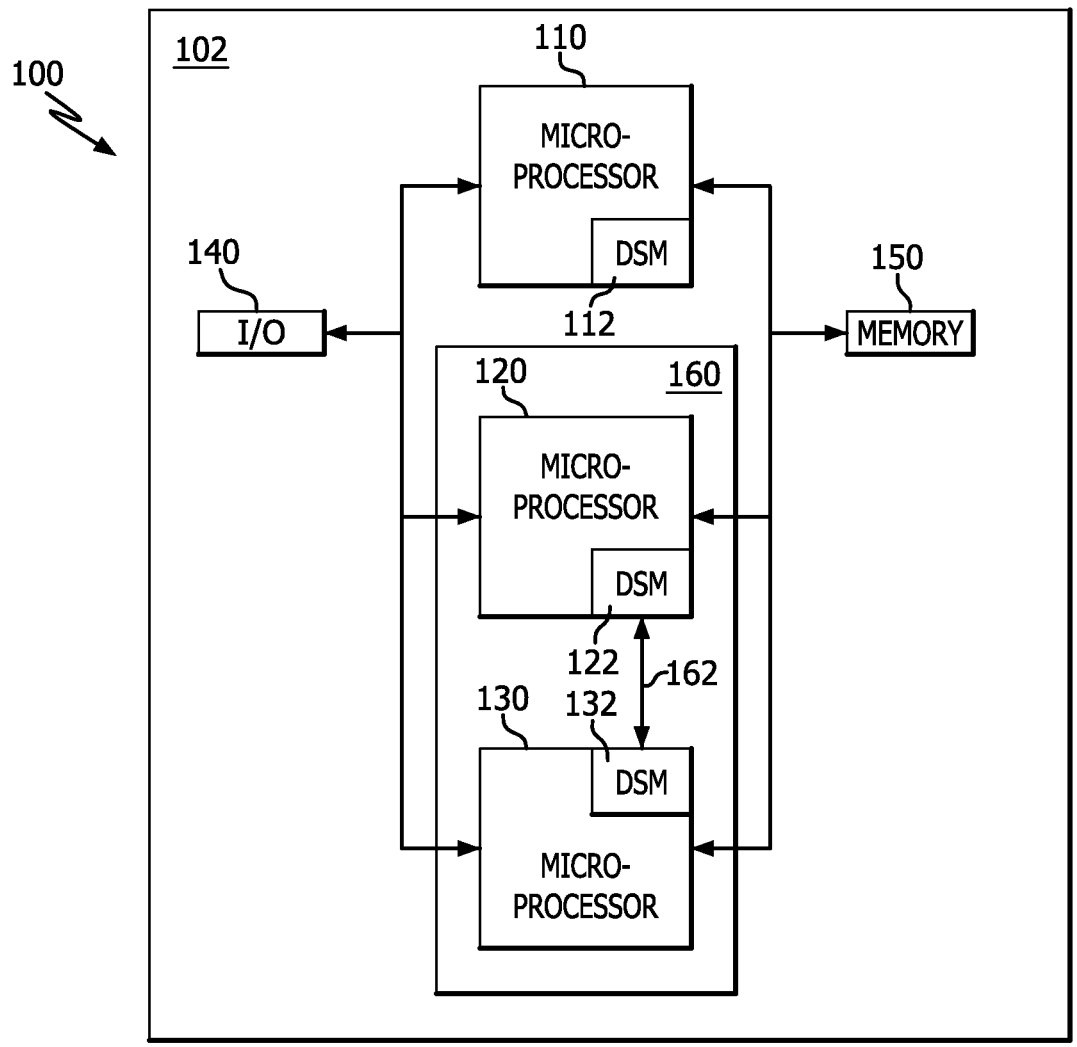
FIG. 1 is a block diagram of a computing system, in accordance with an embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein relate to debug techniques implemented using debug circuits which may be integrated with multiple electronic modules of an integrated circuit. Debug state machines (DSMs) are exemplary debug circuits that may be employed in a variety of contexts. For example, a distinct DSM may be integrated with each of multiple cores of a multiple-core central processing unit (CPU), as well as being integrated with other electronic modules of the CPU (e.g., a Northbridge, a Southbridge, a Graphics Processing Unit (GPU), a special purpose processor, other types of processors, and so on), in an embodiment. Embodiments also include apparatus and methods that facilitate inter-communications between distinct DSMs within a single integrated circuit, between DSMs of multiple integrated circuits of a multi-chip module (MCM), and between DSMs of multiple packaged devices (e.g., DSM inter-communications from socket-to-socket). This inter-communication is referred to herein as "cross triggering."

DSMs may provide significant visibility to what is occurring in the electronic modules with which they are integrated. By providing methods and apparatus by which DSMs may communicate with each other, state-related aspects of a system that involve simultaneous participation of multiple electronic modules (e.g., multiple cores, a Northbridge, a Southbridge, a GPU, and so on) may be more accurately debugged. In various embodiments, the inter-communications made possible with the cross triggers enables the activities of the various DSMs to be tracked and coordinated across an entire system. Accordingly, the context of DSM activities across the entire system may be comprehended.

Before discussing the details of the various embodiments in detail, certain terminology is defined below to enhance understanding of the various embodiments. As used herein, a "DSM" refers to a discrete instantiation of debug circuitry (e.g., a state machine) that is integrated with an electronic module of a computing system, and which is configured to detect one or more "triggering events" and to perform one or more responsive "actions," where both the triggering events and the actions are events that occur in the context of debug operations for the computing system.

A DSM is configured to provide visibility (e.g., to external test equipment, such as a Hardware Debug Tool (HDT)) to the electronic module's functionality. The term "integrated with," as used herein to describe the coupling between a DSM and an electronic module, means that the DSM is electrically and/or communicatively coupled with portions of the electronic module that enable the DSM to detect signals produced by the electronic module (and/or other portions of the computing system within which the electronic module is integrated).

For example, but not by way of limitation, a DSM that is "integrated with" an electronic module may have access to one or more registers and/or other data storage locations within the electronic module, which enable the DSM to receive trace data that is produced and/or received by the electronic module while the electronic module is performing various operations (e.g., while the electronic module is executing software associated with a trace or test case). In an embodiment, observability of the trace data is provided to a DSM by way of a "debug bus," which provides an interface between portions of the electronic module and the DSM with which it is integrated. A DSM that is "integrated with" an electronic module is included on the same die as the electronic module, in an embodiment. The DSM may be included within the physical footprint of the electronic module or outside the physical footprint of the electronic module, in various embodiments.

As used herein, the term "triggering event" means an event detected by a DSM, which causes the DSM to take a particular action (e.g., based on a trigger-to-action mapping adhered to by the DSM). An "event" may be the receipt of a signal (or a combination of signals), the detection of a value (e.g., a register, clock or counter value) or another event that is detectable by the DSM, for example. Triggering events may be "internal" or "external." An "internal triggering event" means an event that is generated within the DSM itself, and which provides an impetus for the DSM to perform a responsive action. An "external triggering event" means an event that is generated or provided by a source external to the DSM (e.g., a debug bus, another DSM, and so on), and which also provides an impetus for the DSM to perform a responsive action.

One type of external triggering event is a "cross trigger," which is a signal that is conveyed over one or more dedicated communication lines between DSMs (referred to herein as a "cross trigger bus"). "Cross triggering" is a term that is used to refer to communication methods and apparatus by which multiple DSMs of a computing system may communicate to coordinate their operations. U.S. Patent Publication No. 2012/0151263 A1, which is incorporated herein by reference as if fully set forth, describes various modes of cross triggering.

Similar to triggering events, actions also may be "internal" or "external." An "internal" action is initiated by a particular DSM in response to a triggering event, where the internal action has a direct effect within the DSM itself. For example, but not by way of limitation, an internal action may include the DSM performing a state transition, generating a signal that is consumed within the DSM itself, and updating a value in an internal register. In contrast, an "external" action means a signal that is generated by a DSM in response to an internal or external triggering event, where the external action is observable by other DSMs and/or other components of the computing system. For example, but not by way of limitation, an external action may include the DSM generating a cross trigger on the cross trigger bus. In addition to providing cross triggers for analysis by other DSMs, a DSM may perform the action of triggering external analysis equipment (e.g., an HDT). DSMs also, optionally, may externally "irritate" as triggering events are detected, where the term "irritate" may be defined as a DSM initiating or preventing events in logic external to the DSM.

The computing system may be implemented on a single die, in an MCM, and/or as a plurality of discretely packaged devices (e.g., socketed devices disposed on one or more printed circuit boards (PCBs)). In an embodiment, DSMs that are integrated with multiple electronic modules of a single die communicate with each other over the cross trigger bus, which also is an integral part of the die. In other embodiments, discussed in more detail below, DSMs of different die of an MCM may communicate cross triggers between each other, and/or DSMs in devices installed in different sockets of a PCB (or multiple PCBs) may communicate cross triggers between each other.

FIG. 1 is a simplified block diagram of a computing system 100, in accordance with an example embodiment. It should be understood that FIG. 1 is a simplified representation of a computing system 100 for purposes of explanation and ease of description, and FIG. 1 is not intended to limit the subject matter in any way. Practical embodiments of the computing system 100 may include other devices and components for providing additional functions and features, and/or the computing system 100 may be part of a larger system, as will be understood. In other words, although a particular configuration of computing, memory, and other electrical components is depicted in FIG. 1, it is to be understood that the example configuration is intended to provide a framework for discussing embodiments of the inventive subject matter. Accordingly, the example configuration is not intended to depict all components of a functional computing system, and the embodiments are not intended to be limited to implementation within a computing system having the configuration of FIG. 1.

Computing system 100 is contained on a motherboard 102 (a printed circuit board), which includes one or more sockets, busses, slots, connectors, and conductors (not illustrated) with which various computing, memory, and other electrical components of the system are physically, electrically, and/or communicatively coupled. More particularly, computing system 100 includes at least one microprocessor 110, 120, 130, one or more input/output (I/O) peripherals 140, and memory 150. Although computing system 100 may include a number of other system components (e.g., clocks, power supplies, other processing components, discrete electronics, and so on), such components are excluded from FIG. 1 and are not discussed herein for the purposes of clarity and simplicity.

The I/O peripherals 140 generally represent the hardware, software, and/or firmware components configured to support communications to/from the microprocessors 110, 120, 130 and one or more peripheral (or external) devices. For example, the I/O peripherals 140 may be realized as busses or other communications interfaces configured to support data transmission to/from the microprocessors 110, 120, 130 in accordance with one or more data communication protocols. Memory 150 generally represents the main memory or primary memory for the computing system 100. Depending on the embodiment, memory 150 may be realized as a hard disk, flash memory, ROM memory, RAM memory, another suitable storage medium known in the art or any suitable combination thereof. Memory 150 maintains data and/or program instructions to support operations of the computing system 100 and/or microprocessors 110, 120, 130 as will be appreciated in the art. In an exemplary embodiment, memory 150 that is implemented separately from microprocessors 110, 120, 130 (e.g., on another chip and/or die) may be understood as being external to microprocessors 110, 120, 130.

Microprocessor 110 represents a discrete processing component that is implemented on a single die that is separately packaged from other system components, whereas microprocessors 120, 130 represent processing components that form portions of an MCM 160 (i.e., an electronic package that includes multiple die and/or other discrete components). Each of microprocessors 110, 120, 130 may include one or more DSMs 112, 122, 132, which may communicate and coordinate operations through the implementation of cross triggering. To implement die-to-die cross triggering, cross triggers may be communicated between the DSMs 122, 132 via a Die-to-Die Communication Link (DDCL 162) or other communications interface between DSMs 122, 132. In addition or alternatively, cross triggering may be implemented between DSMs on die within different packages (referred to herein as "socket-to-socket cross triggering"), in another embodiment. For example, cross triggering may be implemented between DSMs 112, 122 of microprocessors 110 and 120, which are housed in different packages.

Figure 2:
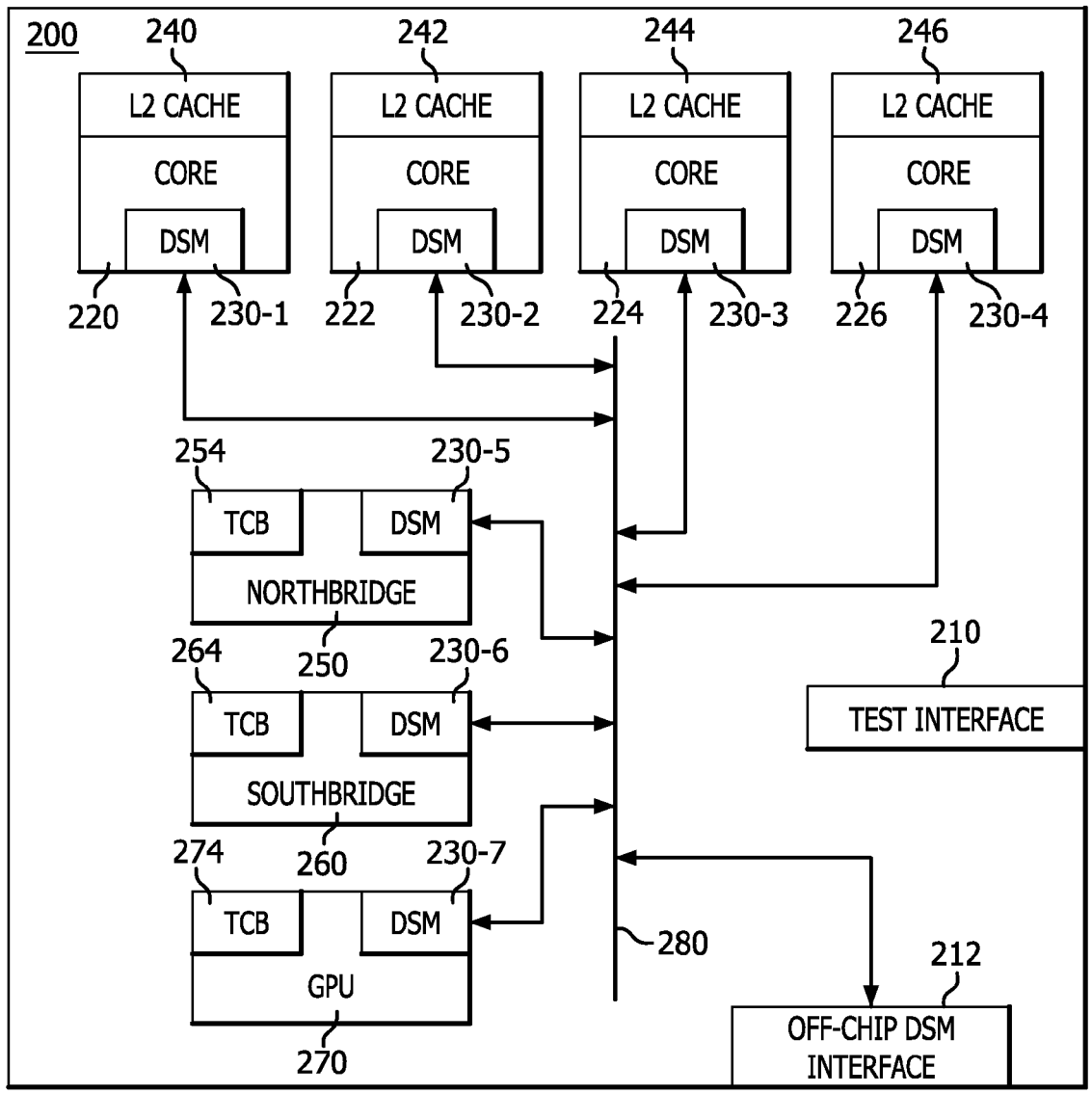
FIG. 2 is a block diagram of a system on a chip, in accordance with an embodiment.

Any one or more of microprocessors 110, 120, 130 may comprise a SOC, which includes a plurality of electronic modules, each of which includes at least one DSM. FIG. 2 is a block diagram of a SOC 200, in accordance with an example embodiment. It should be understood that FIG. 2 is a simplified representation of a SOC 200 for purposes of explanation and ease of description, and FIG. 2 is not intended to limit the subject matter in any way. Practical embodiments of the SOC 200 may include other devices and components for providing additional functions and features, as will be understood.

In an exemplary embodiment, SOC 200 includes a plurality of processing cores 220, 222, 224, 226 (each with an integrated DSM 230-1, 230-2, 230-3, 230-4), a plurality of trace data storage elements 240, 242, 244, 246, 254, 264, 274 (e.g., L2 caches and Trace Capture Buffers (TCBs)), a Northbridge 250 (or memory controller) (with an integrated DSM 230-5), a Southbridge 260 (with an integrated DSM 230-6), a GPU 270 (with an integrated DSM 230-7), and a cross trigger bus 280. Cross triggering to DSMs (not illustrated) on other die within the same package (e.g., in an MCM) and/or other packages may be achieved via off-chip DSM interface 212. Although FIG. 2 depicts each of processing cores 220, 222, 224, 226, Northbridge 250, Southbridge 260, and GPU 270 as including an associated DSM 230-1, 230-2, 230-3, 230-4, 230-5, 230-6, 230-7 (collectively "230"), some of these electronic modules may not include a DSM. In such cases, the electronic module may, instead, simply port signals in and out, as they relate to debug operations, or some of these electronic modules may not support debug operations at all.

Although SOC 200 is illustrated as including four cores 220, 222, 224, 226, a SOC may include more or fewer cores, in other embodiments (including as few as one single core). In addition, although SOC 200 is illustrated as including a single Northbridge 250, Southbridge 260, and GPU 270, some or all of these electronic modules may be excluded from SOC 200 (e.g., they may be located off-chip), in other embodiments. Furthermore, although SOC 200 is illustrated as including only one Northbridge 250, a SOC may include more than one Northbridge, in other embodiments. Besides the processing components and busses illustrated in FIG. 2, a SOC may include additional or different processing components, busses, and other electronic devices and circuitry, in various embodiments.

Processing cores 220, 222, 224, 226 generally represent the main processing hardware, logic and/or circuitry for the SOC 200, and each processing core 220, 222, 224, 226 may be realized using one or more arithmetic logic units (ALUs), one or more floating point units (FPUs), one or more memory elements (e.g., one or more caches), discrete gate or transistor logic, discrete hardware components, or any combination thereof. Although not illustrated in FIG. 2, each processing core 220, 222, 224, 226 may implement its own associated cache memory element (e.g., a level one or L1 cache) in proximity to its respective processing circuitry for reduced latency.

Northbridge 250, which also may be referred to as a "memory controller," in some systems, is configured to interface with I/O peripherals (e.g., I/O peripherals 140, FIG. 1) and memory (e.g., memory 150, FIG. 1). Northbridge 250 controls communications between the components of SOC 200 and the I/O peripherals and/or external memory. Southbridge 260, which also may be referred to as an "I/O controller hub," in some systems, is configured to connect and control peripheral devices (e.g., relatively low speed peripheral devices). GPU 270 is a special purpose microprocessor, which offloads and accelerates graphics rendering from cores 220, 222, 224, 226.

In the illustrated embodiment, caches 240, 242, 244, 246 and TCBs 254, 264, 274 provide intermediary memory elements having reduced size relative to external memory for temporarily storing data and/or instructions retrieved from external memory or elsewhere, and/or data produced by processing cores 220, 222, 224, 226, Northbridge 250, Southbridge 260, and GPU 270. For example, in an embodiment, caches 240, 242, 244, 246 and TCBs 254, 264, 274 provide memory elements for storing debug information (or "trace data") collected and/or produced by DSMs 230 during debug operations associated with the respective electronic modules with which they are integrated. In the illustrated embodiment, caches 240, 242, 244, 246 are in close proximity to and coupled between a respective processing core 220, 222, 224, 226 and the Northbridge 250. In this regard, caches 240, 242, 244, 246 may alternatively be referred to as core-coupled caches, and each core-coupled cache 240, 242, 244, 246 maintains data and/or program instructions previously fetched from external memory that were either previously used by and/or are likely to be used by its associated processing core 220, 222, 224, 226. Caches 240, 242, 244, 246 are preferably larger than L1 caches implemented by the processing cores 220, 222, 224, 226 and function as level two caches (or L2 caches) in the memory hierarchy. SOC 200 also may include another higher level cache (e.g., a level three or L3 cache, not illustrated) that is preferably larger than the L2 caches 240, 242, 244, 246.

In an exemplary embodiment, the SOC 200 includes a test interface 210 that comprises a plurality of pins dedicated for use in testing and/or configuring the functionality of the SOC 200. In one embodiment, the test interface 210 is compliant with the IEEE 1149.1 Standard Test Access Port and Boundary-Scan Architecture, that is, the Joint Test Action Group (JTAG) standards. Although the interconnections are not specifically illustrated in FIG. 2, the DSMs 230 are coupled to the test interface 210 and receive signals and/or bits from the test interface 210 that establish (or "program") a configuration for each DSM 230. In response, each DSM 230 operates according to the programmed configuration.

Each DSM 230 may be configured (e.g., programmed) differently from the other DSMs 230 in SOC 200 and/or in other parts of a computing system. More particularly, a DSM 230 may be programmed by establishing values in various DSM registers, which essentially pre-select which triggering events a DSM 230 may take action in response to detecting, and also pre-select the corresponding actions. In addition, certain triggering events and actions may not be programmable (e.g., pre-selectable), and a DSM 230 may take a particular action in response to a particular triggering event regardless of any DSM programming that may have been performed. As used herein, the term "widget" refers to a software routine that is configured, when executed, to program a DSM in a particular way (e.g., to establish particular DSM register values, resulting in the pre-selection of triggers, state transitions, and actions). In other words, a "widget" may be considered a setup program for a DSM. A "widget" also may be defined as a machine-readable program that enables a DSM to perform a set of state transitions in response to detecting that pre-selected triggers were produced. Diagnostic software may be configured to coordinate the execution of a sequence of widgets to configure DSMs 230 in various manners that provide a desired system visibility. The diagnostic software may be executed on the computing system (e.g., computing system 100) in which the DSMs 230 are incorporated, or on external test equipment.

According to an embodiment, a DSM 230 of an embodiment may support one or more functions selected from a group consisting of: 1) trace start/stop; 2) trace filtering; 3) cross triggering between DSMs; 4) clock stopping; 5) triggering external analysis equipment (e.g., providing HDT interrupts); and 6) providing a flexible microcode interface.

Cross triggering may be implemented via a cross trigger bus 280. Cross trigger bus 280 may include one or more, bi-directional conductors, which provide for signaling communication between DSMs 230. According to a particular embodiment, cross trigger bus 280 includes four parallel conductors, although cross trigger bus 280 may include more or fewer conductors, in other embodiments. Cross trigger bus 280 may be considered to be a "communications interface" between DSMs 230.

In response to detecting the occurrence of a triggering event for which a DSM 230 automatically should respond or that the DSM 230 has been programmed to respond to (e.g., a "pre-select triggering event"), the DSM 230 performs a corresponding action, as mentioned previously. According to an embodiment, a trigger-to-action map may be programmed into the DSM 230, which instructs the DSM 230 as to which particular action to perform when it detects a particular triggering event. The types of triggering events to which a DSM 230 will respond, and the responsive actions that the DSM 230 will implement depend, at least in part, on the DSM's programming, as mentioned above. In addition, certain types of internal and external triggering events and certain types of internal and external actions may be commonly attributed to DSMs 230 that are integrated with particular types of electronic modules (e.g., DSMs 230-1 through 230-4 that are integrated with cores 220, 222, 224, 226 may take different actions in response to different triggering events from the actions taken in response to triggering events detected by a DSM 230-5 that is integrated with Northbridge 250). For example, but not by way of limitation, a DSM 230 may be programmed to take one or more actions in response to one or more triggering events as follows:

Internal triggering events: A DSM may internally generate and respond to one or more internal triggering events selected from a group consisting of, but not limited to: a counter matching a first value; a clock count matching a second value; trace data matching a third value; trace data exceeding a fourth value; debug data matching a fifth value; a debug bus bit having a pre-defined state; a debug bus bit transition occurring; a random event occurring (e.g., as determined based on seed, polynomial, match, and mask registers); and a flag being asserted.

External triggering events: A DSM may detect and respond to one or more external triggering events selected from a group consisting of, but not limited to: receiving one or more signals from one or more sources external to the first electronic module, wherein the one or more signals are selected from a group consisting of a cross trigger signal on the communications interface; a trap signal; a clock stop signal; an error signal; a performance monitor ("perfmon") signal or event; an interrupt; a breakpoint; a microcode-based trigger (e.g., breakpoints, performance monitors, interrupts, and error events); and a timer overflow.

Internal Actions: In response to a triggering event, a DSM may take one or more internal actions selected from a group consisting of, but not limited to: performing a state transition; clearing a clock counter; stopping a counter; incrementing a general purpose counter; toggling a state bit of a general purpose counter; clearing a general purpose counter; setting or clearing a flag; toggling a random number; and enabling a pseudo-random event generator that may be used as a triggering event source for the DSM.

External Actions (e.g., "irritator actions"): In response to a triggering event, a DSM may take one or more external actions selected from a group consisting of, but not limited to: generating a cross trigger signal on the communications interface (e.g., asserting a cross trigger on the cross trigger bus 280, a die-to-die cross trigger, or a socket-to-socket cross trigger); generating a core stop clock signal; generating a die-wide stop clock signal; generating a self-refresh signal for a memory (e.g., memory 150, FIG. 1); generating a communication interface receive disable signal; generating a trace store signal; generating a machine check exception (MCE) signal; generating a debug event signal; triggering a debug microcode interrupt; setting and clearing various bits in a DSM microcode register to be read by microcode upon a debug microcode interrupt; starting storage of debug data to a state capture buffer (e.g., to a TCB and/or L2 cache); stopping storage of debug data to a state capture buffer; storing a clock count to a state capture buffer; and changing the size of a queue.

Figure 3:
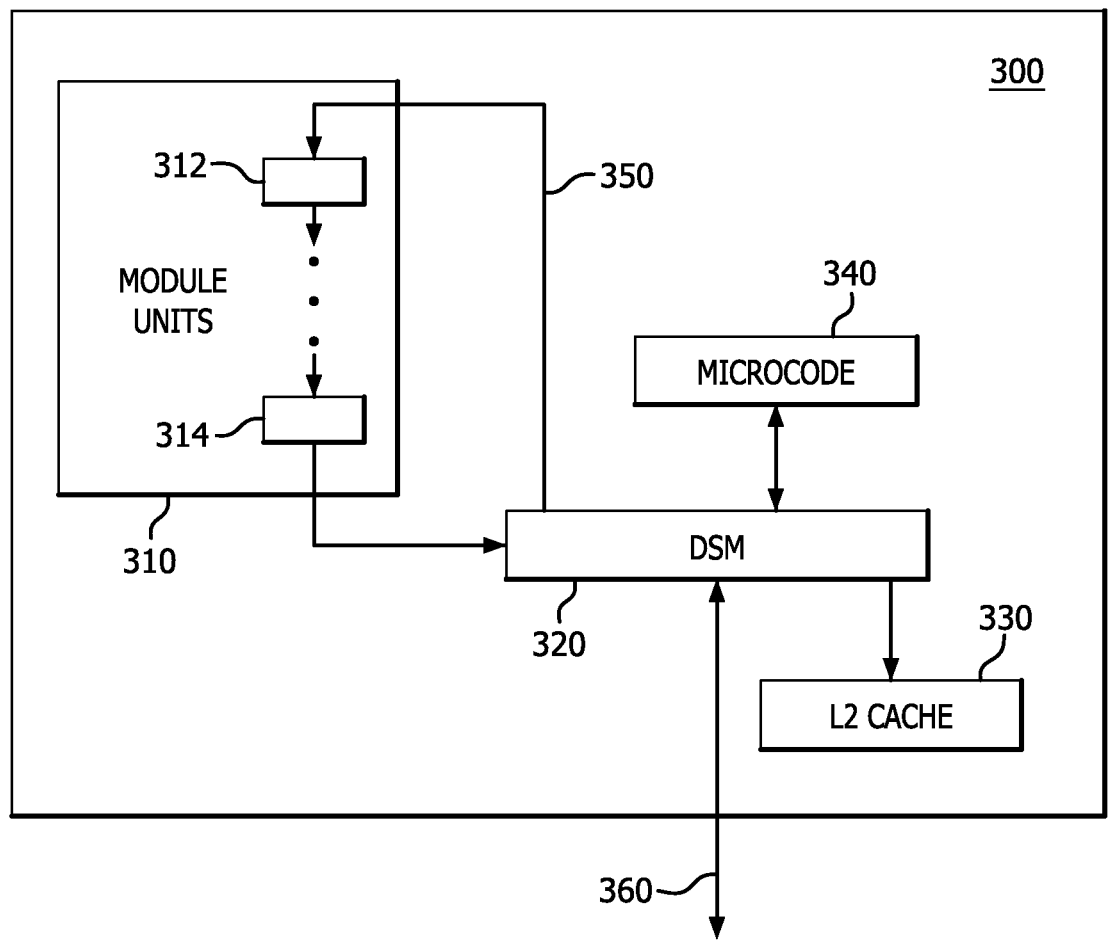
FIG. 3 is a block diagram of an electronic module with an integrated debug state machine, in accordance with an embodiment.

FIG. 3 is a block diagram of an electronic module 300 with an integrated DSM 320, in accordance with an embodiment. For example, electronic module 300 may be a processing core (e.g., one of cores 220, 222, 224, 226, FIG. 2), although electronic module 300 may be a different type of electronic module, as well. In an embodiment in which electronic module 300 is a processing core, DSM 320 may interface with microcode 340. This interface enables DSM 320 to observe the microcode being executed by the electronic module 300 and/or to modify execution of the microcode by the electronic module 300. In addition, as mentioned previously, DSM 320 may be capable of storing trace data in trace data storage (e.g., L2 cache 330), which includes information collected and/or produced by DSM 320 during execution of various operations performed by the electronic module 300.

Electronic module 300 also includes one or more "module units" 310, each of which may be configured to perform a set of actions or computations associated with the functionality of electronic module 300. DSM 320 is integrated with the various module units 310 by way of debug bus 350. Essentially, debug bus 350 functions as a conduit through which signals produced at various observability points 312, 314 within the module unit 310 may be conveyed to DSM 320. Although only two observability points 312, 314 are shown in FIG. 3, a multitude of observability points may be established along debug bus 350.

At each observability point 312, 314, various multiplexing structures may funnel data onto the debug bus 350. Some or all of the signals received via debug bus 350 may be considered as triggering events by DSM 320, which may invoke DSM 320 to produce a cross trigger on a cross trigger bus 360, as described in more detail elsewhere, herein.

Figure 4:
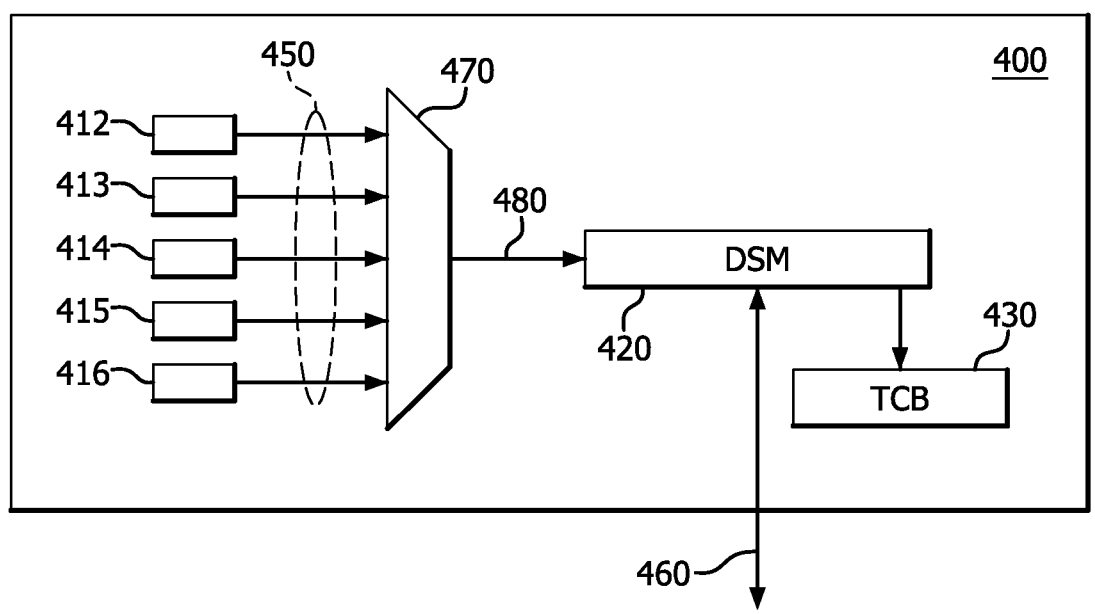
FIG. 4 is a block diagram of an electronic module with an integrated debug state machine, in accordance with another embodiment.

In the FIG. 3 embodiment, debug bus 350 is configured as a ring bus, although a debug bus may be differently configured, as well (e.g., a debug bus may have a parallel structure, such as depicted in FIG. 4, or similar star structure). In an embodiment, debug bus 350 is 64 bits wide, although debug bus 350 may be wider or narrower, in other embodiments. An advantage to the ring bus structure is that the structure may provide data from numerous observability points 312, 314 without the necessity for extensive parallel routing. However, the ring bus structure may have increased latency when compared with a parallel bus implementation, particularly for observability points (e.g., point 312) that occur earlier in the ring bus.

FIG. 4 is a block diagram of an electronic module 400 with an integrated DSM 420, in accordance with another embodiment. For example, electronic module 400 may be a Northbridge (e.g., Northbridge 254, FIG. 2), a Southbridge (e.g., Southbridge 264, FIG. 2), or a GPU (e.g., GPU 274, FIG. 2), although electronic module 400 may be a different type of electronic module, as well. In an embodiment, as mentioned previously, DSM 420 may be capable of storing trace data in trace data storage (e.g., TCB 430), which includes information collected and/or produced by DSM 420 during execution of various operations performed by the electronic module 400.

DSM 420 is integrated with various observability points 412, 413, 414, 415, 416 of electronic module 400 by way of debug bus 450 and multiplexer (MUX) 470. Although MUX 470 is shown as a single multiplexer, MUX 470 may be implemented as a hierarchical structure in other embodiments. In hierarchical debug bus structure, a number of observability points may be linked in series with respect to other observability points that the bus serves.

Debug bus 450 and MUX 470 function as a conduit through which signals produced at the various observability points 412-416 within electronic module 400 may be conveyed to DSM 420. The output lines 480 from MUX 470 may be fed directly into DSM 420, in an embodiment. Although only five observability points 412-416 are shown in FIG. 4, a multitude of observability points may be established on debug bus 450. At each observability point 412-416, various multiplexing structures may funnel data onto the debug bus 450.

In the embodiment illustrated in FIG. 4, debug bus 450 is configured as a parallel bus. In an embodiment, debug bus 450 may have any number of parallel inputs to MUX 470, although only five are shown in FIG. 4, and the output lines 480 may be 64 bits wide. Alternatively, the output lines 480 may be wider or narrower, in other embodiments. Some or all of the signals received via output lines 480 may be considered as triggering events by DSM 420, which may invoke DSM 420 to produce a cross trigger on a cross trigger bus 460, as described in more detail elsewhere, herein. An advantage to the parallel bus structure is that the structure may provide reduced latency, when compared with the ring bus structure of FIG. 3. However, the parallel bus structure may warrant more extensive parallel routing, particularly when it is desirable to connect the debug bus 450 to numerous observability points.

The actual circuitry of a DSM may have any of a number of configurations that are suitable to facilitate the performance of debug operations within a system. The observability points 312, 314, 412-416 may be provided with debug bus wrapper circuitry to perform various debug processes in response to triggers with respect to the particular section of hardware being observed and to pass resultant debug data through the respective debug bus 350, 450. In an embodiment, the debug bus wrapper circuitry is integrated with its respective section of observed hardware and shares the power and/or voltage domain of that section of hardware.

The power and/or voltage domains of the respective sections of hardware observed at the observability points 312, 314, 412-416 may differ from each other and from the power and/or voltage domains of the respective DSM 320, 420. One reason that the hardware sections may be configured with different power or voltage domains is to permit selected components to be switched off or powered at a lower level to conserve energy, which may translate into longer battery life for battery powered devices.

For example, in modern system-on-chip design, various hardware sections may reside in dynamically-controlled voltage domains. During a power off event a supply rail to an individual voltage domain may be completely shut off, causing all digital state to be lost. Debugging in the presence of dynamically switching power domains is a challenge since the observability points, e.g., the debug wrappers, also lose their programmed states when the domain is powered down.

Figure 5:
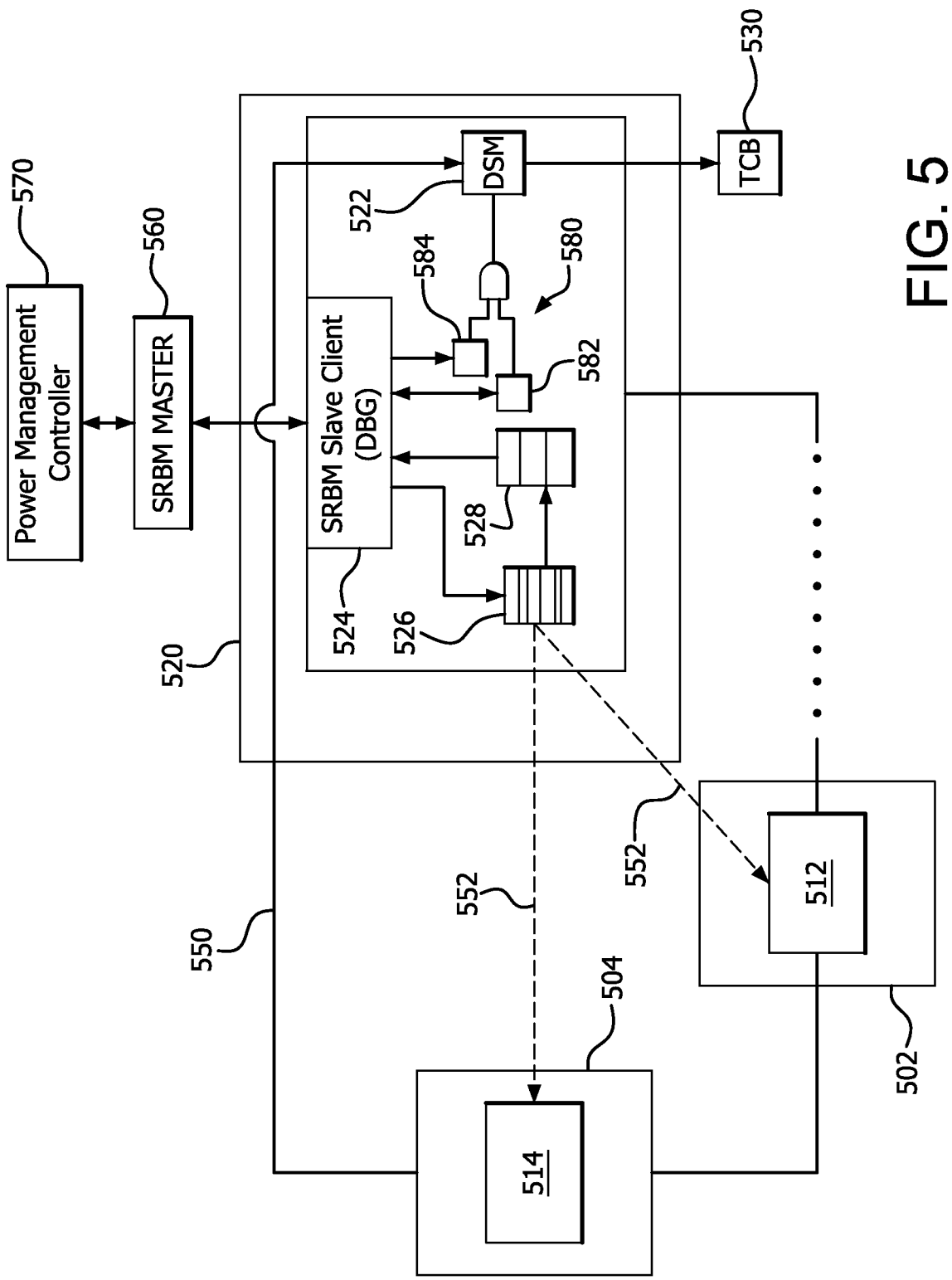
FIG. 5 is a block diagram of a debug circuit in accordance with an embodiment.

For debug, it is desirable to have complete visibility of the functional hardware sectors before the power is removed and after the power is restored. Since the respective debug wrappers lose the programming state they were in prior to the power down event, the debug bus does not have observation of a powered down sector when the sector powers up. In FIG. 5 an example embodiment is provided that enables the debug bus to have observation as soon as the power is restored to be able to debug issues in the restoration process. The FIG. 5 embodiment provides an example that addresses the issue by reprogramming the debug wrappers back to their original states to have a continued observation of the functional hardware sectors being debugged.

The example embodiment provided in FIG. 5 illustrates a sample implementation where a debug bus data path traverses both an always-on voltage domains and a dynamically-powered voltage domain. In the FIG. 5 example, the debug circuitry includes a debug control circuitry 520 that includes a DSM component 522, a debug system register bus manager (SRBM) slave client 524 that controls a debug SRBM register 526. A ring type debug bus 550 is provided that communicates in series with a plurality of observability points associated with hardware sectors to provide test result data back to the DSM 522 that may be stored in a trace capture buffer (TCB) 530. Although the debug bus in the FIG. 5 example is of a ring configuration, this example is equally applicable where the debug bus configuration is of another configuration such as depicted in FIG. 4 or otherwise.

In the example of FIG. 5, two hardware sectors are depicted, 502, 504 that are integrated with respective debug wrappers 512, 514 where one sector 504 resides in a dynamically-controlled voltage domain and the other sector 502 resides in an "always on" voltage domain. Although the term "always on" is used in this example, the entire hardware component in which the debug circuitry resides may itself be selectively powered on and off. For example, the debug circuitry associated with core 220 of FIG. 2 may be powered as a whole in the same selective manner that the core 220 is powered with respect to the other cores and components of the SOC 200. As such, "always on" is used as a term relative to the dynamically-controlled voltage domain to indicate that the dynamically-controlled voltage domain may be turned off while the always on domains remain on. This may also happen with respect to different dynamically-controlled voltage domains, since one such domain may be controlled differently from another such domain.

The FIG. 5 example is non-limiting. There may be any combination of hardware sector domains served by the debug bus 550 including configurations where all of the hardware sectors reside in different dynamically-controlled voltage domains.

The debug SRBM slave client 524 coordinates the data sent over the debug bus 550 in accordance with instructions received from a SRBM master controller 560. Data, such as configuration and/or programming data, for the debug wrappers becomes deposited in the SRBM register 526 which is then conveyed by the SRBM slave client 524 via the debug bus 550 to the appropriate debug wrapper 512, 514 to configure and/or program the wrapper or to make changes in the wrapper's configuration or programming as may be desirable for a particular debugging procedure.

Where, for example, the debug bus is in a star configuration, the SRBM register 526 data may be directly conveyed to the respective wrappers 512, 514 as indicated by the dashed lines 552. In the case of the ring-type debug bus 550, the data is conveyed in series along the ring to the respective wrappers 512, 514.

A power management controller 570 is operable to control the power to the various power domains of the hardware sectors 502, 504. It may also provide information as to which domains are on and which are off as well as information when a power state transition is to occur for a particular power domain.

To quickly restore, for example, the programming of a debug wrapper 514 that resides in a dynamically-controlled voltage domain, a shadow SRBM register 528 is provided to save copies of the data most recently used for programming such debug wrappers.

In the FIG. 5 example, the power management controller 570 is responsible for controlling the power state transitions for the dynamically-controlled power domains, such as the one for hardware sector 504. The power management controller 570 also communicates to the debug circuitry 520 via the SRBM master controller 560.

The debug wrappers 512, 514 may be programmed using the SRBM network independent of the physical location of the programming registers. The power management controller may have access to all programmable registers of the debug bus via the same register network.

For a case when hardware sector 504 of FIG. 5 is being debugged and its domain gets powered down, the wrapper 514 loses its original programmed state. At a restoration of power, the debug bus 550 cannot properly access the hardware sector 504 via its wrapper 514, since the wrapper has lost its programming when the power was shut off. It will be recognized that there may be a plurality of sectors within a hardware component residing in the same dynamically-controlled voltage domain that each has an associated debug wrapper. The example is equally applicable to such circumstance.

The debug circuitry 520, power management controller 570 and the master SRBM 560 reside in an always on power domain and may act to immediately restore the programming/configuration of debug wrapper 514 through the use of shadow SRBM register 528.

The debug wrapper 514 via the debug bus 550 may be programmed by writing to the programmable SRBM register 526. The content of this register 526 is then also stored in the shadow SRBM register 528 so that it may later be read back by the power management controller to program the debug wrapper 514 back to its pre-off transition state after power is restored to the "less on" domain in which hardware sector 504 resides.

In the FIG. 5 example, the power management controller 570 is aware of the power state events and may auto-initiate a read transaction from the shadow SRBM register 528. Programmable register circuitry 580 may be added to the debug circuitry 520 to indicate to the controller 570 if a write transaction to the debug bus registers need to be executed to avoid performance penalty in functional modes.

An example of the functioning and a sample programming sequence for the register 582, 584 of the programmable register circuitry 580 in the save and restore process is described below.

Register 582, DBGSAVERESTORE_EN [1:0] may be programmed in advance of the debug bus being used. Register 584, is programmed with an indication of whether the save restore process is to be started DBGSAVERESTORE_START.

The power management controller 570 via the SRBM network may read register 582. DBGSAVERESTORE_EN[0]= 0 may indicate that controller 570 will restore the debug bus wrapper 514 from the shadow SRBM register 528. DBGSAVERESTORE_EN[1]=1 may indicates that when DBGSAVERESTORE_START=1, the Debug State Machine 522 will be triggered to indicate that it should ignore data on the debug bus with respect to sectors residing in the dynamically-controlled voltage domain, in the example sectors 504.

The power management controller programming sequence may proceed as follows when the dynamically-controlled voltage domain of, for example sector 504, powers up after getting powered down by the controller 570:

The controller reads DBGSAVERESTORE_EN [1:0];
If DBGSAVERESTORE_EN[0]=1;
The controller writes DBGSAVERESTORE_START=1;
   If DBGSAVERESTORE_EN[1]=1, DBGSAVERESTORE_START=1 is used as an indicator for the DSM to not look at the debug bus data with respect to hardware sector 504;
The controller reads the shadow SRBM register 528;
The controller programs the SRBM register 526 based on the read data to initiate programming mode of the debug wrapper 514;
The controller writes DBGSAVERESTORE_START=0 to indicate to the DSM that the data on debug bus is valid to sample again with respect to the hardware sector 504.

For the sake of brevity, conventional techniques related to integrated circuit design, caching, memory operations, memory controllers, and other functional aspects of the systems (and the individual operating components of the systems) have not been described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It will also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It will be understood that various changes may be made in the function and arrangement of elements without departing from the scope defined by the claims, which includes known equivalents and foreseeable equivalents at the time of filing this patent application.

The invention claimed is:

1. An integrated circuit (IC) comprising:
   a plurality of hardware sectors, each hardware sector associated with a debug observability circuit that is served by a debug data bus of a debug circuit, wherein the plurality of hardware sectors includes one or more steady state sectors residing in an always on power domain that remains on whenever the debug circuit is operable;
   the plurality of hardware sectors including a controlled sector residing in a dynamically-controlled power domain that may be turned off while the power domain of another sector remains on;
   a debug data register configured to provide data to the debug observability circuit of the controlled sector via the debug data bus;
   a shadow register configured to receive and store the data provided to the debug observability circuit of the controlled sector; and
   control circuitry configured to utilize the data stored in the shadow register upon a restoration of power to the controlled sector to restore the debug observability circuit associated with the controlled sector to a state reflective of its state when the controlled sector was previously powered on.

2. The IC according to claim 1 wherein:
   the plurality of hardware sectors include a plurality of controlled sectors residing in dynamically-controlled power domains that may be turned off while the power domain of another sector remains on;
   the debug data register is configured to provide data to the debug observability circuit of each of the controlled sectors via the debug data bus;
   the shadow register is configured to receive and store the data provided to the debug observability circuit of each of the controlled sectors; and
   the control circuitry is configured to utilize the data stored in the shadow register upon a restoration of power to a respective controlled sector to restore the debug observability circuit associated with the respective controlled sector to a state reflective of its state when the respective controlled sector was previously powered on.

3. The IC according to claim 2 wherein:
   the plurality of hardware sectors includes one or more steady state sectors residing in an always on power domain that remains on whenever the debug circuit is operable.

4. The IC according to claim 1 wherein the debug observability circuits are configured as debug wrapper circuits.

5. The IC according to claim 1 where the data is configuration and/or programming data wherein the control circuitry includes:
   a debug system register bus manager (SRBM) slave client configured to control the debug data register and the shadow register;
   a SRBM master controller configured to instruct the SRBM slave client; and
   a power management controller configured to control the dynamically-controlled power domain of the controlled sector and to provide instructions with respect to utilizing the data stored in the shadow register to restore the state of the debug observability circuit state of the controlled sector.

6. The IC of claim 5, wherein the control circuitry includes programmable register circuitry configured to indicate to the power management controller if data stored in the shadow register should be utilized to avoid performance penalty in functional modes.

7. The IC according to claim 1 wherein the plurality of hardware sectors are associated with the debug data bus in a ring configuration.

8. The IC according to claim 1 wherein the plurality of hardware sectors are associated with the debug data bus in a star configuration.

9. A debug method for integrated circuit (IC) comprising:
providing a plurality of hardware sectors, each hardware sector associated with a debug observability circuit that is served by a debug data bus of a debug circuit where the plurality of hardware sectors includes a controlled sector residing in a dynamically-controlled power domain that may be turned off while the power domain of another sector remains on and includes one or more steady state sectors residing in an always on power domain that remains on whenever the debug circuit is operable;
providing data to the debug observability circuit of the controlled sector via the debug data bus;
receiving and storing the data provided to the debug observability circuit of the controlled sector in a shadow register; and
utilizing the data stored in the shadow register upon a restoration of power to the controlled sector to restore the debug observability circuit associated with the controlled sector to a state reflective of its state when the controlled sector was previously powered on.

10. The method according to claim 9 where the plurality of hardware sectors include a plurality of controlled sectors residing in dynamically-controlled power domains that may be turned off while the power domain of another sector remains on, further comprising:
providing data to the debug observability circuit of each controlled sector via the debug data bus;
receiving and storing the data provided to the debug observability circuit of each controlled sector in a shadow register; and
utilizing the data stored in the shadow register upon a restoration of power to a respective controlled sector to restore the debug observability circuit associated with the respective controlled sector to a state reflective of its state when the respective controlled sector was previously powered on.

11. The method according to claim 9 where the data is configuration and/or programming data wherein the utilizing the data stored in the shadow register is performed by:
a debug system register bus manager (SRBM) slave client configured to control the shadow register;
a SRBM master controller configured to instruct the SRBM slave client; and
a power management controller configured to control the dynamically-controlled power domain of the controlled sector and to provide instructions with respect to utilizing the data stored in the shadow register to restore the state of the debug observability circuit state of the controlled sector.

12. The method according to claim 11 where the utilizing the data stored in the shadow register is further performed by programmable register circuitry configured to indicate to the power management controller if data stored in the shadow register should be utilized to avoid performance penalty in functional modes.

13. A non-transitory computer-readable storage medium storing a set of instructions for execution by a general purpose computer to facilitate manufacture of an integrated circuit that includes:
a plurality of hardware sectors, each hardware sector associated with a debug observability circuit that is served by a debug data bus of a debug circuit, wherein the plurality of hardware sectors includes one or more steady state sectors residing in an always on power domain that remains on whenever the debug circuit is operable;
the plurality of hardware sectors including a controlled sector residing in a dynamically-controlled power domain that may be turned off while the power domain of another sector remains on;
a debug data register configured to provide data to the debug observability circuit of the controlled sector via the debug data bus;
a shadow register configured to receive and store the data provided to the debug observability circuit of the controlled sector; and
control circuitry configured to utilize the data stored in the shadow register upon a restoration of power to the controlled sector to restore the debug observability circuit associated with the controlled sector to a state reflective of its state when the controlled sector was previously powered on.

14. The non-transitory computer-readable storage medium of claim 13, where the data is configuration and/or programming data and the dynamically-controlled power domain is a dynamically-controlled voltage domain wherein the selectively switchable data bus component includes:
a debug system register bus manager (SRBM) slave client configured to control the debug data register and the shadow register;
a SRBM master controller configured to instruct the SRBM slave client; and
a power management controller configured to control the dynamically-controlled power domain of the controlled sector and to provide instructions with respect to utilizing the data stored in the shadow register to restore the state of the debug observability circuit state of the controlled sector.

15. The non-transitory computer-readable storage medium of claim 14, wherein the control circuitry includes programmable register circuitry configured to indicate to the power management controller if data stored in the shadow register should be utilized to avoid performance penalty in functional modes.

16. The non-transitory computer-readable storage medium of claim 13, wherein the plurality of hardware sectors are associated with the debug data bus in a ring configuration.

17. The non-transitory computer-readable storage medium of claim 13, wherein the plurality of hardware sectors are associated with the debug data bus in a star configuration.

18. The non-transitory computer-readable storage medium of claim 13, wherein the instructions are hardware description language (HDL) instructions used for the manufacture of a device.

* * * * *